US007859057B2

(12) United States Patent
Yedinak et al.

(10) Patent No.: US 7,859,057 B2
(45) Date of Patent: Dec. 28, 2010

(54) WIDE BANDGAP DEVICE IN PARALLEL WITH A DEVICE THAT HAS A LOWER AVALANCHE BREAKDOWN VOLTAGE AND A HIGHER FORWARD VOLTAGE DROP THAN THE WIDE BANDGAP DEVICE

(75) Inventors: Joseph A. Yedinak, Mountain Top, PA (US); Richard L. Woodin, North Yarmouth, ME (US); Christopher L. Rexer, Mountain Top, PA (US); Praveen Muralheedaran Shenoy, Wilkes-Barre, PA (US); Kwanghoon Oh, Seoul (KR); Chongman Yun, Seoul (KR)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/536,618

(22) Filed: Aug. 6, 2009

(65) Prior Publication Data
US 2009/0315040 A1 Dec. 24, 2009

Related U.S. Application Data

(62) Division of application No. 11/828,283, filed on Jul. 25, 2007, now Pat. No. 7,586,156.

(60) Provisional application No. 60/833,362, filed on Jul. 26, 2006.

(51) Int. Cl.
*H01L 27/02* (2006.01)

(52) U.S. Cl. .............................. 257/363; 257/E29.193
(58) Field of Classification Search ................. 257/355, 257/363, E29.022, E29.193; 438/280, 309
See application file for complete search history.

(56) References Cited

U.S. PATENT DOCUMENTS

| 4,904,609 | A | * | 2/1990 | Temple | 438/140 |
| 4,927,772 | A | * | 5/1990 | Arthur et al. | 438/140 |
| 5,170,231 | A | * | 12/1992 | Fujii et al. | 257/77 |
| 5,270,223 | A | * | 12/1993 | Liu | 438/312 |
| 5,544,038 | A | * | 8/1996 | Fisher et al. | 363/147 |
| 5,814,884 | A | * | 9/1998 | Davis et al. | 257/723 |
| 5,962,876 | A | * | 10/1999 | Yu | 257/133 |
| 6,113,632 | A | * | 9/2000 | Reif | 623/2.4 |
| 6,144,093 | A | * | 11/2000 | Davis et al. | 257/723 |
| 6,297,552 | B1 | * | 10/2001 | Davis et al. | 257/723 |
| 6,316,793 | B1 | * | 11/2001 | Sheppard et al. | 257/103 |
| 6,353,236 | B1 | * | 3/2002 | Yatsuo et al. | 257/77 |
| 6,404,050 | B2 | * | 6/2002 | Davis et al. | 257/724 |

* cited by examiner

*Primary Examiner*—Thomas L Dickey
(74) *Attorney, Agent, or Firm*—Thomas R. FitzGerald, Esq.; Hiscock & Barclay, LLP

(57) ABSTRACT

A method and device for protecting wide bandgap devices from failing during suppression of voltage transients. An improvement in avalanche capability is achieved by placing one or more diodes, or a PNP transistor, across the blocking junction of the wide bandgap device.

16 Claims, 5 Drawing Sheets

WIDE BANDGAP DEVICE IN PARALLEL WITH A DEVICE THAT HAS A LOWER AVALANCHE BREAKDOWN VOLTAGE AND A HIGHER FORWARD VOLTAGE DROP THAN THE WIDE BANDGAP DEVICE

CROSS-REFERENCE TO RELATED APPLICATIONS

This application is a divisional of U.S. patent application Ser. No. 11/828,283 filed Jul. 25, 2007 which claims priority from U.S. Provisional Patent Application Ser. No. 60/833,362, filed on Jul. 26, 2006, which applications are hereby incorporated by reference.

FIELD OF THE INVENTION

This invention relates to semiconductor devices, and more specifically, to a method and device for protecting wide bandgap diodes from failing during suppression of voltage transients.

BACKGROUND OF THE INVENTION

Wide bandgap ("WBG") semiconductors are emerging as materials capable of driving continued device performance enhancements for many years to come. These materials are typically defined as exhibiting an electronic bandgap greater than 2 eV. Silicon Carbide (SiC) has been studied for decades, but recent developments have firmly established SiC commercial products in optical, RF, and power components. With extremely high thermal and chemical stability, and electrical performance, WBG devices are used for high frequency, high temperature, and high power applications. Examples of WBG semiconductors are gallium nitride (GaN, $E_G$=3.4 eV), aluminum nitride (AlN, $E_G$=6.2 eV), and silicon carbide (SiC, $E_G$ between 2.2 to 3.25 eV depending on polytype).

Wide bandgap devices afford significant performance advantages compared to silicon semiconductor devices. Silicon carbide Schottky diodes are finding widespread use because of their fast switching speed (low trr), low stored charge (Qrr) and low forward conduction loss. However, wide bandgap devices (e.g., silicon carbide) have poor and erratic avalanche capability due to starting substrate quality. Avalanche breakdown is a form of electric current multiplication that can allow very large currents to flow within materials which are otherwise good insulators. Avalanche breakdown can occur within solids, liquids, or gases when the voltage applied across the insulating material is great enough to accelerate free electrons to the point that, when they strike atoms in the material, they can knock other electrons free. This phenomenon can be quite useful in semiconductor diodes such as the avalanche diode and avalanche photodiode, but in other situations, such as in MOSFET transistors, avalanche breakdown can destroy the device. When avalanche breakdown occurs within a solid insulating material it is almost always destructive. However, improvements in wide bandgap avalanche capability is desired.

A common avalanche diode application is protecting electronic circuits against damaging high voltages. The avalanche diode is connected to the circuit so that it is reverse-biased. In other words, its cathode is positive with respect to its anode. In this configuration, the diode is non-conducting and does not interfere with the circuit. If the voltage increases beyond the design limit, the diode undergoes avalanche breakdown, limiting the harmful voltage. When used in this fashion they are often referred to as clamp diodes because they "clamp" the voltage to a predetermined maximum level. Avalanche diodes are normally specified for this role by their clamping voltage $V_{BR}$ and the maximum size of transient they can absorb, specified by either energy (in joules) or $I^2t$. Avalanche breakdown is not destructive, as long as the diode is not allowed to overheat.

Paralleling a simple zener diode with the wide bandgap device can result in the injection of minority carriers in the wide bandgap device, thus degrading the switching performance of the wide bandgap device. As discussed in U.S. Pat. Nos. 6,144,093 issued to Davis et. al. ("Davis"), and 5,544,038, issued to Fisher et. al. ("Fisher"), when a MOSFET or other MOS gated semiconductor device is used in switching applications in which the gate of the device is repeatedly turned on and off, transient currents can flow through the body diode of the device when the device is turned off, increasing the turnoff time of the device. One solution has been to place a Schottky diode in parallel with and oriented in the direction of the body diode to provide a faster path for the flow of transient currents. Typically, the Schottky diode has a forward voltage drop of about 0.4 V, whereas the body diode typically has a forward voltage drop of 0.7 V. The Schottky diode thus prevents the body diode from conducting because the Schottky diode generally has a lower forward voltage drop than the body diode. However, unlike one embodiment of the present invention, Davis requires at least two wirebond connections and a third connection, and Fisher requires a transistor.

Clamp protection for wideband gap devices that prevents injection of minority carriers in the clamping device which results in degrading the switching speed advantage is desired.

Further, clamp protection that is easy to implement monolithically and provides uniform field distribution for good wide bandgap device termination edge breakdown voltage ("BV") is desired.

Further, clamp protection that has offsetting temperature coefficients of forward and reverse junctions to provide minimal BV temperature coefficients is desired.

Even further, clamp protection that allows avalanche capability to be independently scaled is desired.

SUMMARY OF THE INVENTION

The invention comprises, in one form thereof, a wide bandgap device with improved avalanche capability created by placing a multiple series of diodes across the blocking junction of a wideband gap device.

More particularly, the invention includes a monolithic combination of back to back polysilicon diodes across a part or the entire perimeter of the termination of a wide bandgap diode.

In another form, the invention includes a silicon vertical PNP transistor disposed in parallel with a wide bandgap device.

In another form, the invention includes a method for protecting wide bandgap devices from failing during suppression of voltage transients. The method comprises the steps of paralleling a clamping device with a wide bandgap device so that the reverse transient energy is absorbed by the clamping device. Wherein, the clamping device maintains a BV during avalanche less than the wide bandgap device. Further the clamping device has a higher forward voltage drop Vf than the wide bandgap device preventing forward conduction through the clamping device.

An advantage of one or more embodiments of the present invention is that the wide bandgap device can be rated for avalanche over the rated operating temperature.

A further advantage of one or more embodiments of the present invention is that the clamping device provides a lower avalanching junction that maintains a lower BV than the wide bandgap device during avalanche or UIS.

A further advantage of one or more embodiments of the present invention is to reduce the degradation of switching speed by providing a higher forward voltage drop in the clamping device that prevents the injection of minority carriers in the clamping device during forward bias.

A further advantage of the present invention is that one or more embodiments thereof uses a simple vertical open base transistor used in Insulated Gate Bipolar Transistors ("IGBTs").

An even further advantage of one or more embodiments of the present invention is that PNP gain is optimized by controlling the peak buffer concentration and charge, to thus minimize the temperature coefficient of collector-to-emitter breakdown ("BVceo").

BRIEF DESCRIPTION OF THE DRAWINGS

The present invention is disclosed with reference to the accompanying drawings, wherein.

Corresponding reference characters indicate corresponding parts throughout the several views. The examples set out herein illustrates several embodiments of the invention but should not be construed as limiting the scope of the invention in any manner.

DETAILED DESCRIPTION

Multi-die semiconductor packages are well known in the art, and are generally described in U.S. Pat. Nos. 6,40,050; 6,297,55; 6,113,632; and 5,814,884; all issued to Davis et. al., and which are each incorporated herein by reference.

The method of the present invention is accomplished by paralleling a clamping device having a lower reverse breakdown voltage BV with a wide bandgap device, such that reverse transient energy is absorbed by the clamping device. The clamping device must maintain a BV during avalanche less than the wide bandgap diode. To prevent conduction through the clamping device when the wide bandgap device is forward biased, the clamping device must have a higher voltage drop than the wide bandgap device.

Figure 1:
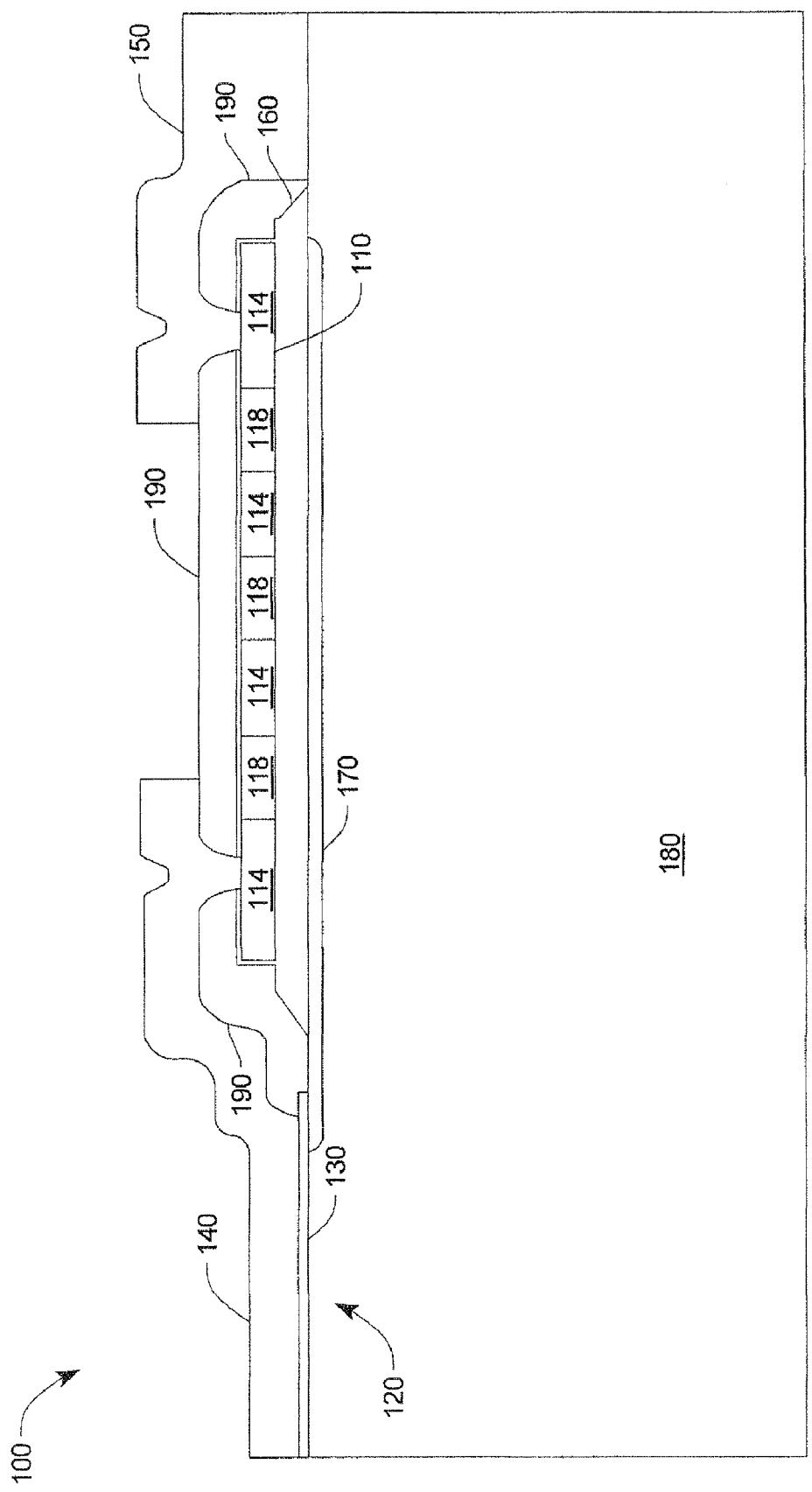
FIG. 1 is a cutaway side view of back to back polysilicon diode clamping placed across the edge termination of a wide bandgap device.

Referring to FIG. 1, there is shown one embodiment 100 of a wide bandgap device consisting of a SiC Schottky diode 120 and a clamping device 110 according to the present invention. The improvement in wide bandgap avalanche capability is achieved by placing a multiple series or "chain" of polysilicon diodes 110, consisting of alternating P doped regions 114 and N doped regions 118, across the blocking junction of the Schottky diode 120. The polysilicon diodes 110 can be placed back to back or in a series stack, where the voltage drop of the polysilicon diodes 110 is greater than the Schottky diode Vf. One example is a monolithic combination of back to back polysilicon diodes 110 across part or the entirety of the perimeter of the edge termination of the Schottky diode 120. The Schottky diode 120 further comprises a Schottky metal anode 130. The polysilicon diodes 110 are connected between anode metal 140 and cathode metal 150, and are built upon an oxide layer 160 situated above a junction termination extension (JTE) 170 and the silicon carbide n-type substrate 180. The polysilicon diodes are situated below a dielectric region 190. In another embodiment, the polysilicon diodes are a separately bonded device and are not situated across the termination of the WBG device (not shown).

In use, this clamping is implemented monolithically across the WBG device edge termination and can by itself provide uniform field distribution for good edge BV. The advantage to this method is that the temperature coefficient of the clamp voltage is near zero due to the offsetting of reverse and forward junctions. However, the current level of the unclamped inductive switching ("UIS") or avalanche protection depends on the area of the polysilicon diodes, and is limited by the diodes' parasitic resistance in avalanche.

Figure 2B:
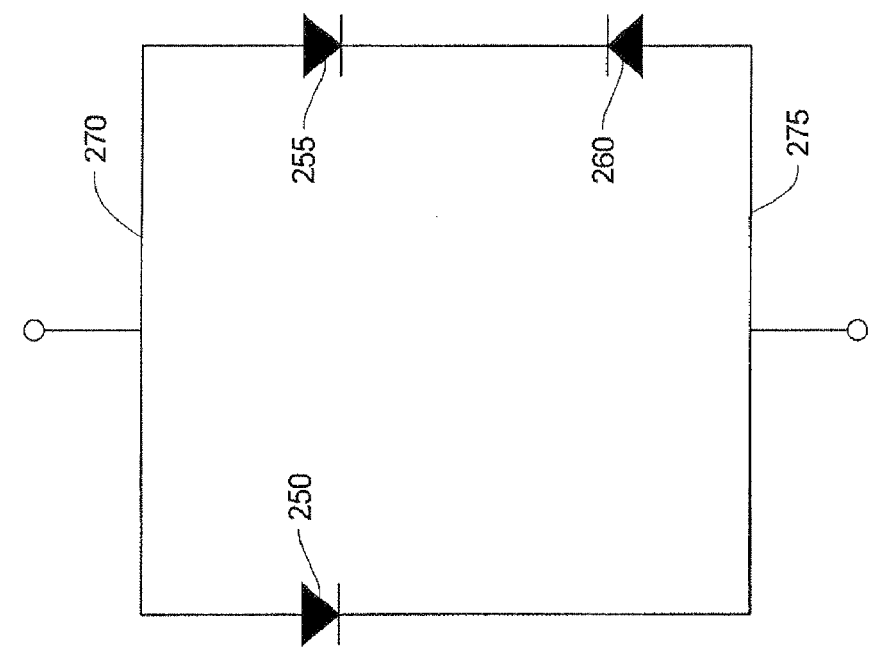
FIG. 2B is a schematic diagram of the devices shown in FIG. 2A.
Figure 2A:
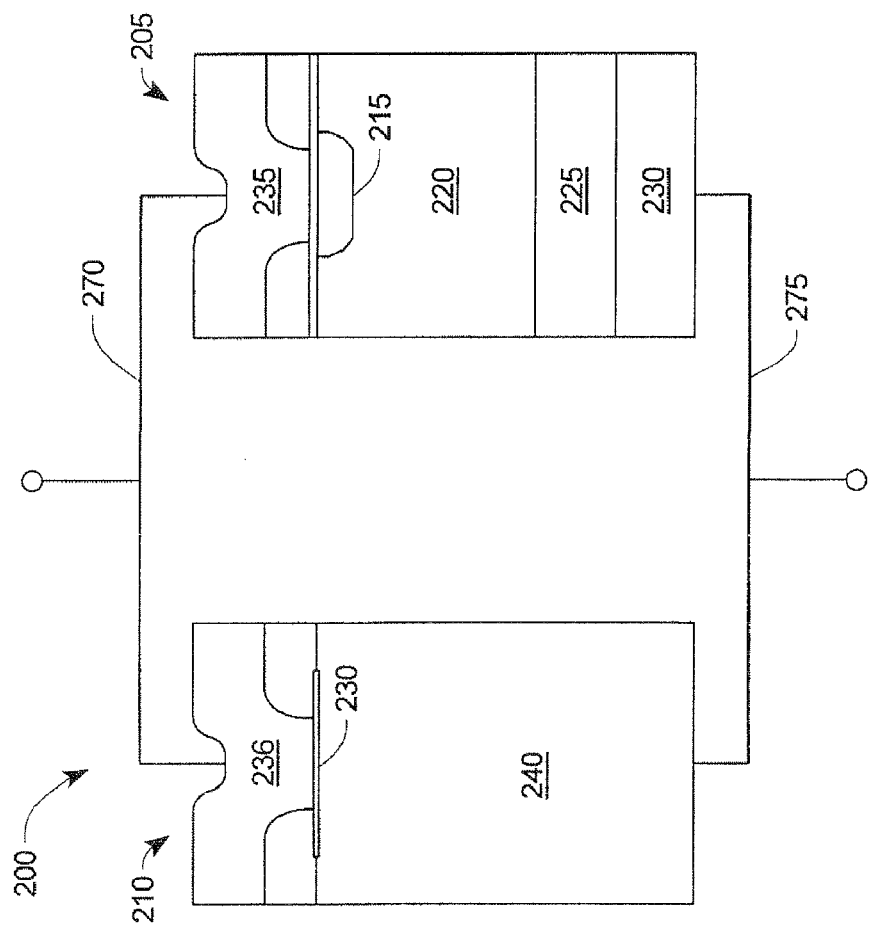
FIG. 2A is a schematic of vertical PNP BVceo clamping for a wide bandgap device.

Turning to FIG. 2A, an alternative embodiment 200 of the present invention is shown. An open base silicon vertical PNP transistor 205 is placed in parallel with a silicon carbide wide bandgap, high voltage (e.g., rated 600V or above) Schottky diode 210. As well known in the art, a traditional PNP transistor is formed by introducing a thin region of N-type semiconductor material between two regions of P-type material. In this embodiment, the PNP transistor 205 has a P doped collector region 215, an N– doped base layer 220, an N doped buffer layer 225, and a P doped emitter layer 230. Metallization 235 contacts the collector region 215. The Schottky diode 210 has a Schottky junction metal layer 230 which contacts metallization 236. The substrate 240 of the Schottky diode is N doped SiC.

FIG. 2B is a schematic representation of the structure shown in FIG. 2A. Diode 250 represents the Schottky diode 210, diode 255 represents the PN junction between the collector region 215 and the N– layer 220, and diode 260 represents the PN junction between the buffer layer 225 and the emitter layer 230.

The PNP transistor 205 and Schottky diode 210 can be bond connected with separate wires or leads 270 and 275 internal or external to the package. For example, the devices can be packaged by methods including, but not limited to: (1) externally connecting the PNP transistor 205 and Schottky diode 210 by wire bonds; (2) mounting the PNP transistor 205 and Schottky diode 210 on the same header, and connecting the top metalizations together; or (3) connecting the PNP transistor 205 and Schottky diode 210 by a single wire bond to the lead frame or external circuit.

In use, the silicon PNP transistor 205 is operated in the BVceo mode when protecting the Schottky diode 210. The buffer layer 225 causes the device to have asymmetrical blocking. When the circuit is forward biased, the PNP transistor 205 remains off and all the current flows through the Schottky diode 210. When reverse biased, the PNP transistor 205 breaks down before the Schottky diode 210, and all the current flows through the PNP transistor 205.

The reverse junction buffer layer 225 should contain sufficient charge to minimize BVceo snapback. The buffer layer 225 is optimized such that the BVceo is maintained in an acceptable range to meet the required minimum blocking voltage and the maximum clamp voltage over temperature. With increasing temperature during UIS, the positive temperature coefficient of BVceo remains lower than a PN diode because of the positive temperature coefficient of the gain.

The thickness of the N− layer 220 should be made such that the electric field does not punch through to the N buffer layer 225 during avalanche.

Figure 3:
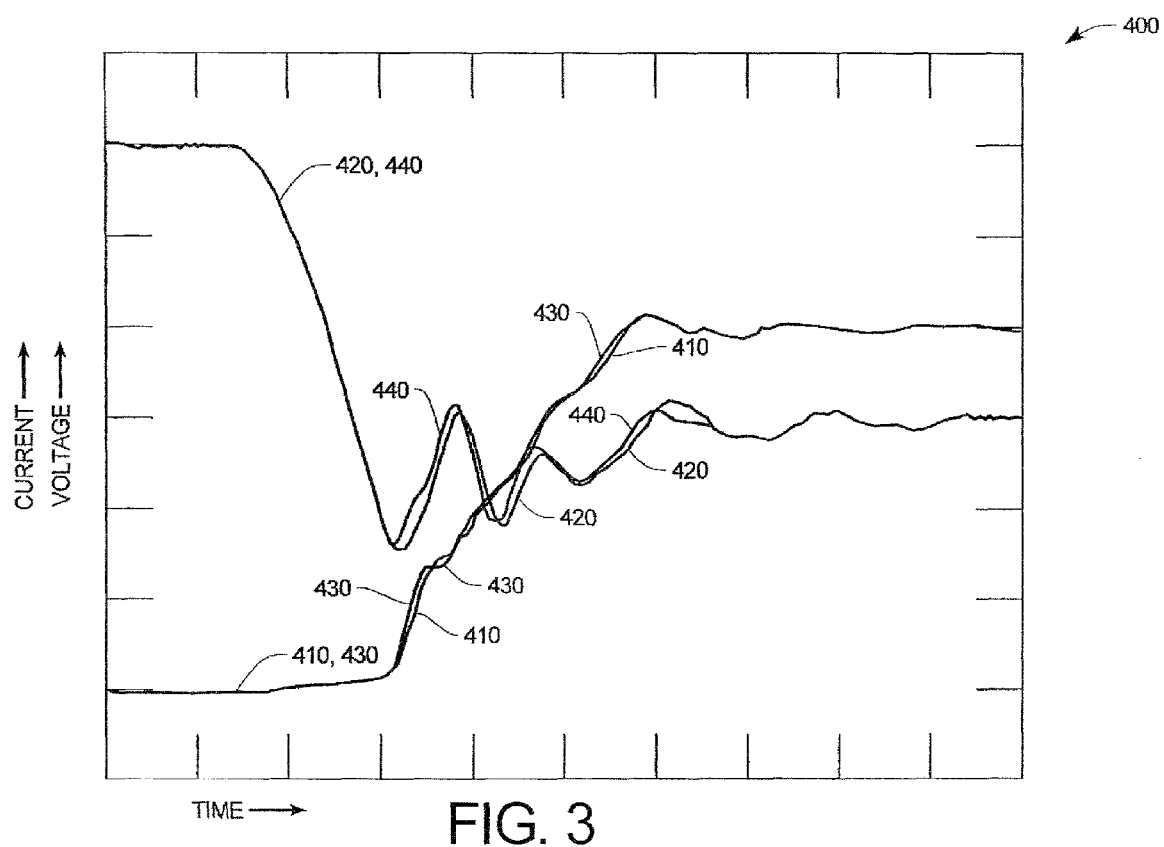
FIG. 3 is a graph of the current through, and the voltage across, the device shown in FIG. 2 and the Schottky diode by itself when the Schottky diode transitions from forward biased to reverse biased.
Figure 3A:
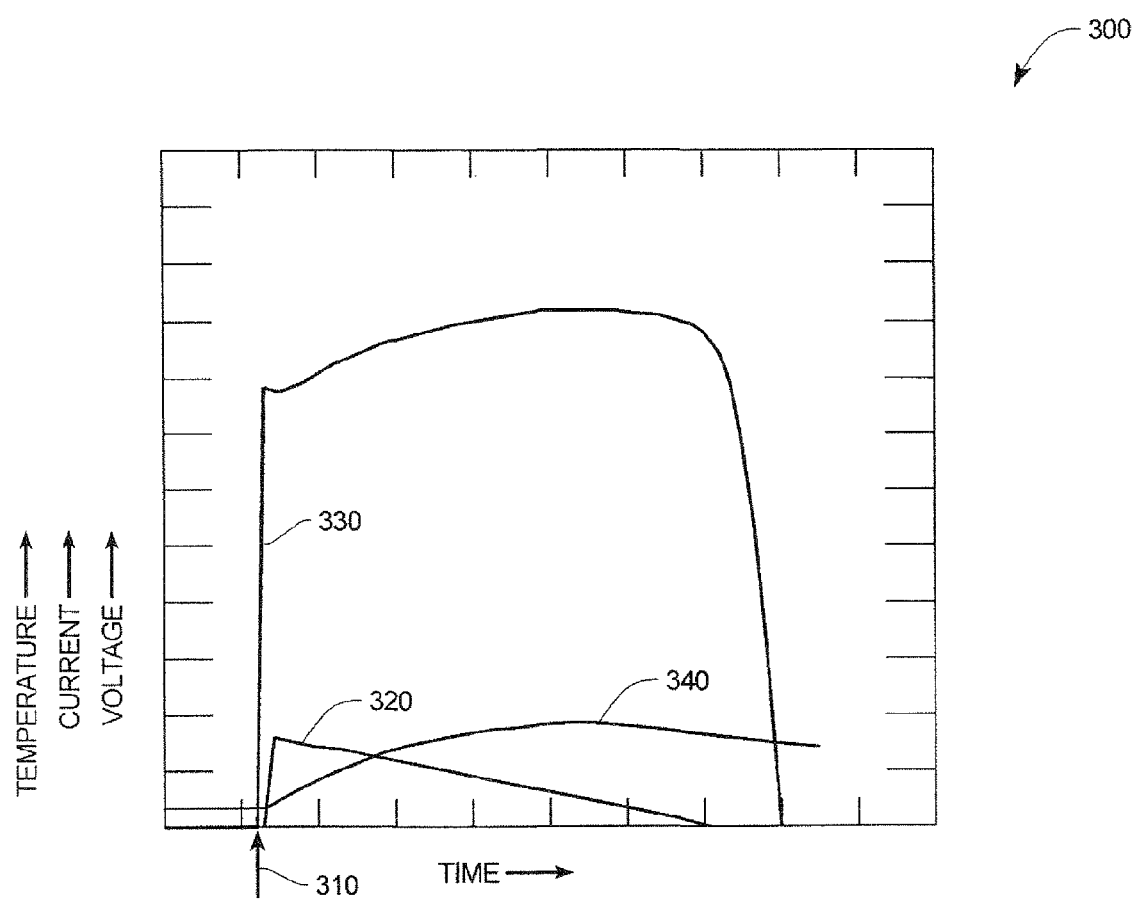
FIG. 3A is a graph of the simulated voltage, current and temperature rise in the clamping device shown in FIG. 2 when the current through the Schottky diode in FIG. 2 flowing into an inductor is removed.
Figure 3B:
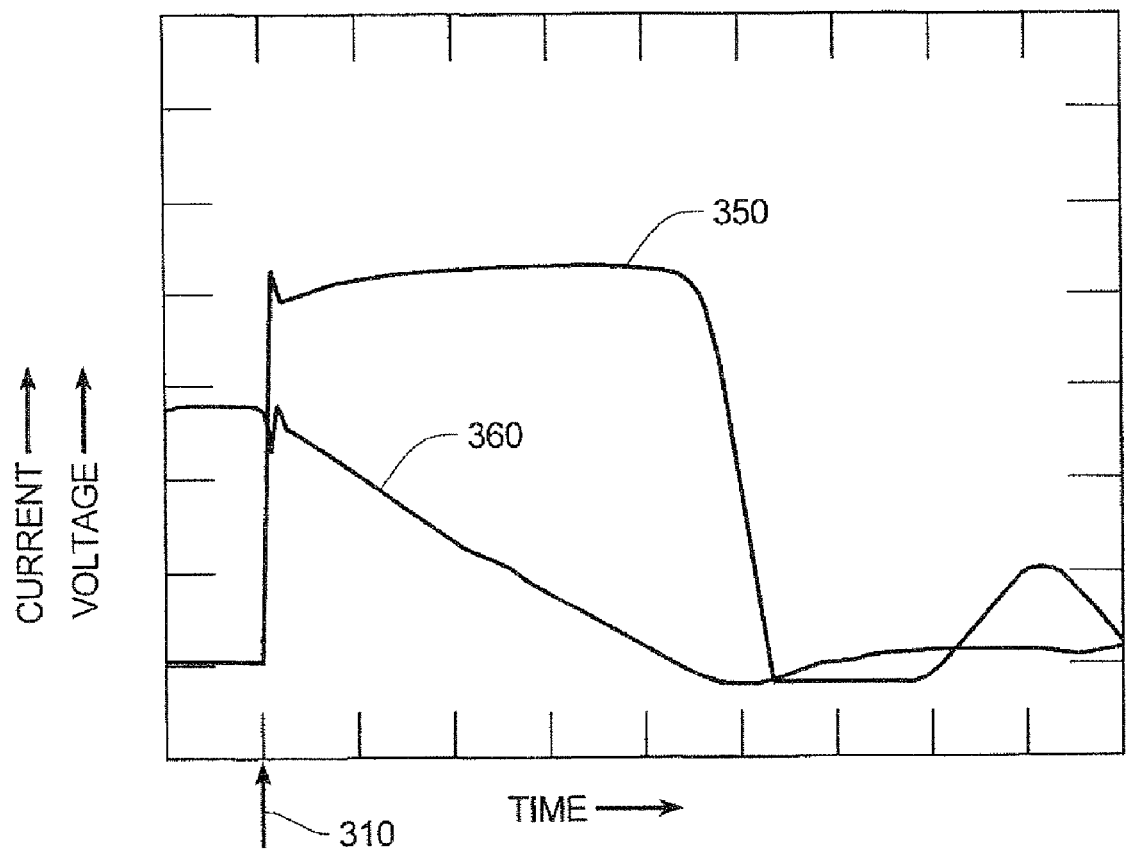
FIG. 3B is a graph of the measured voltage and current under the same conditions as the simulation of FIG. 3A.

The reverse blocking voltage of the PNP transistor 205 should be designed high enough such that all the forward bias current flows through the wide bandgap Schottky diode 210. Absent this, injected minority carriers from the forward biased top junction and avalanching back junction in the PNP transistor 205 will have to be removed by depletion spread and by minority carrier recombination. This will reduce the advantage of a low Qrr and trr that can be achieved by the present invention. FIG. 3 illustrates a measured reverse recovery showing minimal impact on trr of the SiC Schottky diode 210 with and without the PNP transistor 205 in parallel. The Schottky diode 210 had an $I_d$ of 6A, a $V_{DD}$ of 400V, a $T_J$ of 25° C., and a 500A/μsec trr. The line 420 shows the current through and the line 410 the voltage across the Schottky diode 210 when the Schottky diode 210 is in parallel with the PNP transistor 205 as shown in FIG. 2 (the voltage is shown as line 410 in FIG. 3, and the current is shown as line 420), and when the Schottky diode 210 is not connected to the PNP transistor 205 (the voltage is shown as line 430, and the current is shown as line 440). As can be seen the reverse recovery characteristics of the Schottky diode 210 are essentially unaffected by the presence of the PNP transistor 205. The variation shown is attributable to the capacitance of the PNP transistor 205 which was about 15 picofarads for the PNP transistor 205 used to generate the waveforms shown in FIG. 3.

It should be particularly noted that in this embodiment, PNP gain can be tailored to minimize the $BV_{ceo}$ temperature coefficient by optimizing the depths of the N and N- layers. Additionally, only a small area die is required, and avalanche capability can be independently scaled by varying the horizontal cross-sectional area of the PNP transistor 205.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

We claim:

1. An electrical device on a single semiconductor substrate comprising:
    a wide bandgap device; and
    a clamping device comprising two or more diodes in series placed across a blocking junction of said wide bandgap device;
    wherein said clamping device has a lower avalanche breakdown voltage than said wide bandgap device and a higher forward voltage drop than said wide bandgap device.

2. The device of claim 1, wherein said wide bandgap device comprises silicon carbide.

3. The device of claim 1, wherein said wide bandgap device comprises gallium nitride.

4. The device of claim 1, wherein said wide bandgap device comprises diamond.

5. The device of claim 1, wherein said wide bandgap device comprises aluminum nitride.

6. The device of claim 1, wherein said diodes are polysilicon diodes placed back to back.

7. The device of claim 1, wherein said diodes are located within an edge termination region of said device.

8. The device of claim 1, wherein said wide bandgap device is a diode.

9. The device of claim 1, wherein said wide bandgap device is a Schottky diode.

10. The device of claim 1, wherein said wide bandgap device is a MOSFET.

11. The device of claim 1, wherein said wide bandgap device is a JFET.

12. The device of claim 1, wherein said wide bandgap device is a bipolar transistor.

13. The device of claim 1, wherein said wide bandgap device is an insulated gate bipolar transistor.

14. The device of claim 1, wherein said wide bandgap device comprises an anode metal and a cathode metal.

15. The device of claim 14 wherein said diodes are polysilicon diodes connected between said anode and cathode metals.

16. The device of claim 1 wherein said diodes are built upon an oxide layer.

* * * * *